(12) United States Patent
Le et al.

(10) Patent No.: US 6,970,395 B2
(45) Date of Patent: Nov. 29, 2005

(54) MEMORY DEVICE AND METHOD OF READING DATA FROM A MEMORY DEVICE

(75) Inventors: Thoai-Thai Le, Cary, NC (US); Ralf Klein, Deidesheim (DE); Eckhard Brass, Unterhaching (DE); George Alexander, Durham, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/658,130

(22) Filed: Sep. 8, 2003

(65) Prior Publication Data

US 2005/0052943 A1    Mar. 10, 2005

(51) Int. Cl.$^7$ ............................................. G11C 8/00
(52) U.S. Cl. .................. 365/233; 365/194; 365/187.05
(58) Field of Search ............................... 365/233, 194, 365/189.05, 230.08, 105, 205

(56) References Cited

U.S. PATENT DOCUMENTS

| | | | |
|---|---|---|---|
| 5,835,443 A | 11/1998 | Fujita | |
| 5,930,197 A | 7/1999 | Ishibashi et al. | |
| 6,301,191 B1 | 10/2001 | Ooishi | |
| 6,552,955 B1 * | 4/2003 | Miki | 365/233 |
| 6,707,759 B2 * | 3/2004 | Song | 365/233 |
| 2003/0065900 A1 | 4/2003 | Ishibashi et al. | |

OTHER PUBLICATIONS

Copy of International Search Report from corresponding PCT application number PCT/EP2004/010027.

* cited by examiner

*Primary Examiner*—David Lam
(74) *Attorney, Agent, or Firm*—Brinks Hofer Gilson & Lione

(57) ABSTRACT

A memory device includes a delay-locked loop circuit having delay elements and a synchronization circuit coupled to the delay-locked loop circuit. The synchronization circuit receives a synchronization enable signal and outputs a plurality of enable signals, including an enable signal coupled to an output circuit. Because the enable signal is synchronized with the read signal, it is possible to provide more time to read data into the buffer. A method of reading data from a memory device couples a synchronization enable signal and an external clock signal to a synchronization circuit. A read signal and an output enable are generated based upon a synchronization enable signal and a delayed clock signal of the external clock signal. Because the output signal is synchronized to the read signal, more time is allowed for the sense function.

27 Claims, 3 Drawing Sheets

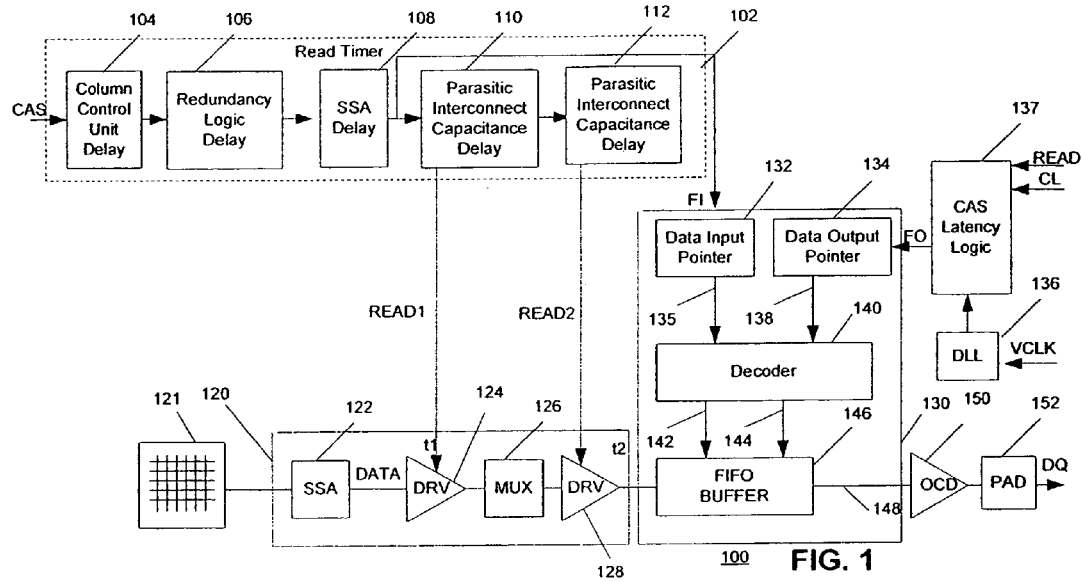
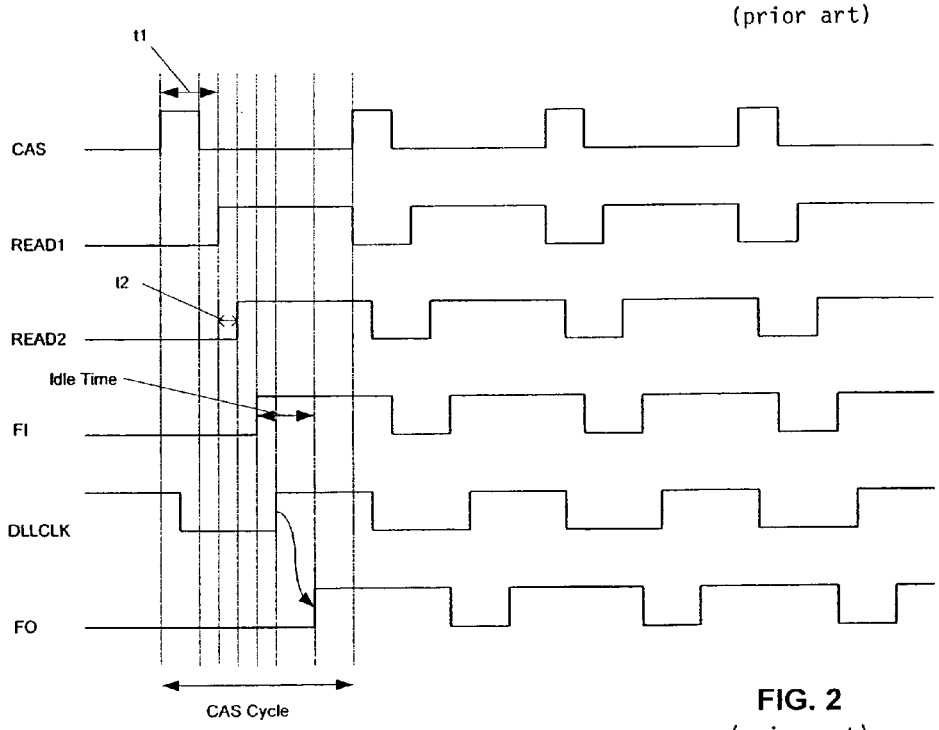
FIG. 1 (prior art)
FIG. 2 (prior art)

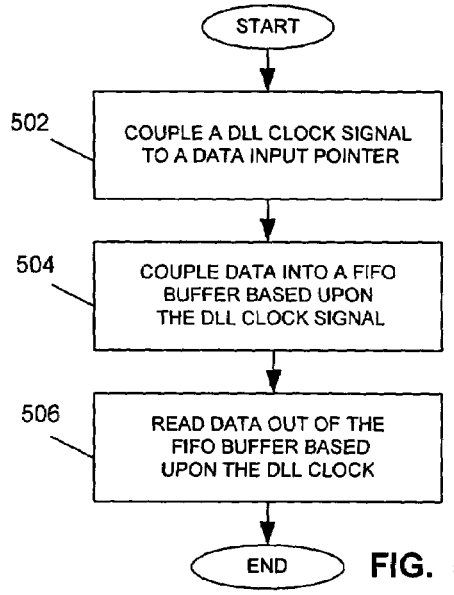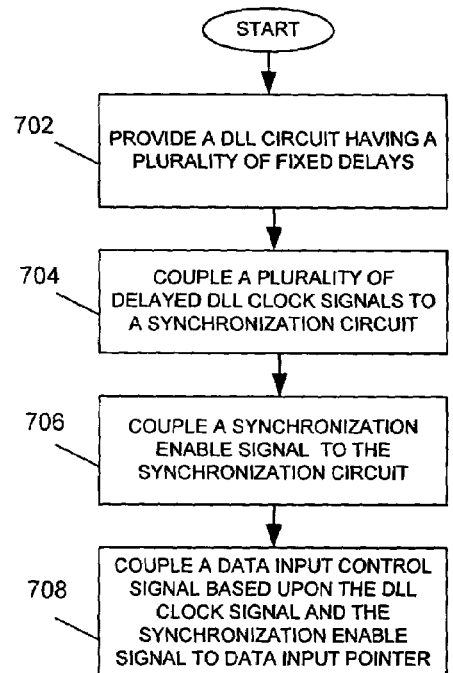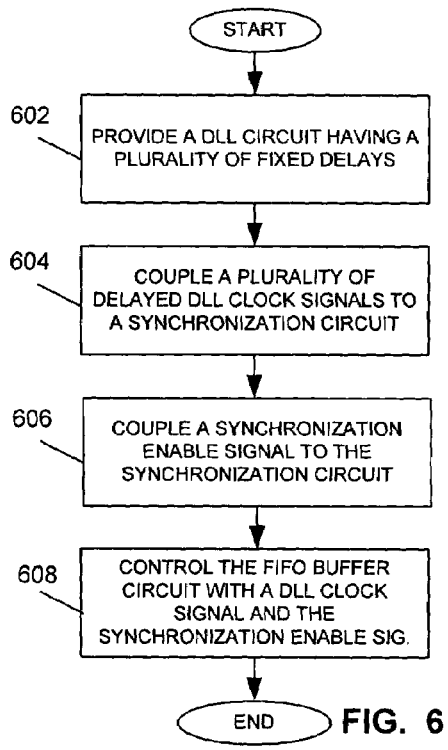
FIG. 5
FIG. 6
FIG. 7

MEMORY DEVICE AND METHOD OF READING DATA FROM A MEMORY DEVICE

FIELD OF THE INVENTION

The present invention relates generally to memory devices, and in particular, to an improved circuit for reading data in a memory device.

BACKGROUND OF THE INVENTION

As electronic devices continue to evolve, the demands on components in the devices continue to grow. There is an ever-increasing demand to improve accuracy and speed, and reduce cost. One device found in virtually all electronic devices is a memory device. There are different kinds of memories employed for different purposes in various electronic devices. Semiconductor memory devices generally fall into two groups: bipolar and metal oxide semiconductor (MOS) devices. While bipolar memories offer higher speeds, MOS memories are generally less expensive to fabricate and offer higher bit densities. Depending upon their functional use, semiconductor memories can also be categorized as random access read-write memories (RAM) or read-only memories (ROM). The primary difference between these two times the memories is that the data pattern of stored information is fixed in a read-only memory, while it is changed during normal operation in a random access memory.

Random access memories generally comprise both static and dynamic memories. A static random access memory (SRAM) retains the indefinitely as long as the power is supplied to the integrated circuit. In contrast, a dynamic random access memory (DRAM) stores data only temporarily and must be continually rewritten or refreshed. In order to improve the clock speed of a dynamic random access memory, a double data rate synchronous DRAM (DDR SDRAM) was developed. A DDR SDRAM activates output on both the rising and falling edge of the system clock, a rather than on just the rising edge, potentially doubling output. In a DDR SDRAM, an asynchronous read timer is used during a readout in the data path to generate signals to indicate when data is sensed in the secondary sense amplifier (SSA) and offer the read/write data line bus. However, timings constraints in a conventional DDR SDRAM significantly minimize the amount of time available to read data from the memory.

Accordingly, there is a need for an improved memory device and method of reading data from a memory device.

SUMMARY OF THE INVENTION

The present invention relates to a memory device which enables a greater amount of time to read data into an output buffer. In particular, a memory device according to one aspect of the present invention comprises a delay-locked loop circuit having a plurality of delay elements and a synchronization circuit coupled to the delay-locked loop circuit. The synchronization circuit also receives a synchronization enable signal and outputs a plurality of enable signals, including an enable signal coupled to an output circuit. Because the enable signal coupled to the output circuit is synchronized with the read signal, it is possible to optimize the time to read data into the buffer.

According to another aspect of the present invention, a method of reading data from a memory device couples a synchronization enable signal to a synchronization circuit. An external clock signal is also coupled to a delay-locked loop circuit. A read signal is generated based upon a synchronization enable signal and a delayed clock signal of the external clock signal. An output enable is also generated based upon the synchronization enable signal and a delayed clock signal of the external clock signal. Because the output signal is synchronized to the read signal, more time is allowed for the sense function.

BRIEF DESCRIPTION OF THE DRAWINGS

FIG. 1 is a conventional circuit for reading data from a memory device;

FIG. 2 is a timing diagram showing the operation of the circuit of FIG. 1;

FIG. 5 is a flowchart showing a method of reading data according to the present invention;

FIG. 6 is a flowchart showing a method of controlling a buffer according to the present invention; and FIG. 7 is a flowchart showing a method of synchronizing a read signal and output signal according to the present invention.

DETAILED DESCRIPTION OF THE DRAWINGS

Figure 3:
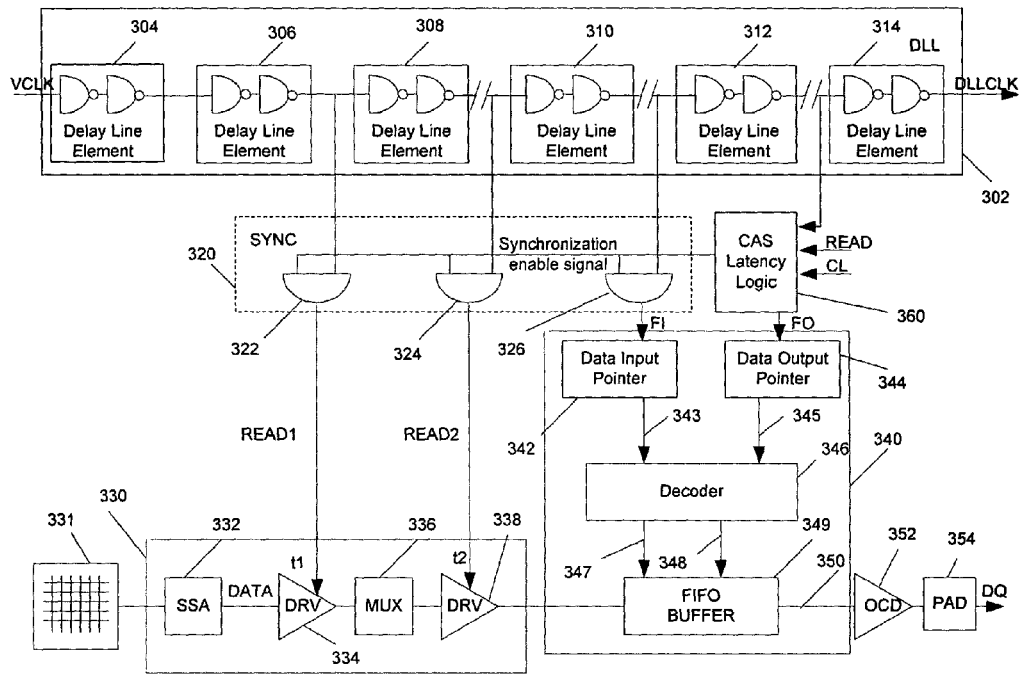
FIG. 3 is a circuit diagram of a memory device according to the present invention.

The memory device and method of the present invention improves the performance of reading data from memory cell by reducing the amount of time of the read cycle. In particular, a conventional read timer having a plurality of inherent delays is replaced by fixed delays in a delay-locked loop (DLL). The various enable signals for reading data from the memory element or outputting data from the memory are synchronized according to fixed delays of the DLL circuit. Accordingly, the timing between the read signal to read data stored in a memory element and the enable signal to output data from the memory device is known. Because the timing of outputting data is optimized, the circuit will have a greater amount of time to read data than a memory device employing a conventional read timer.

Turning first to FIG. 1, a conventional circuit for reading data from a memory device is shown. In particular, a column access signal (CAS) is coupled to a read timer 102. The read timer has a plurality of inherent delays. For example, a column control unit delay 104 is an inherent delay caused by generating the global column control signals. Similarly, a signal sense amplifier (SSA) control logic delay 106 is an inherent delay whereby the control signals of SSA are generated. Further, the signal sense amplifier (SSA) provides a delay 108 associated with the operation of an SSA, as is well known in the art. Finally, parasitic interconnect capacitance delays 110 and 112 are generally parasitic delays associated with the read/write data lines of the memory device.

The read timer 102 generates a plurality of read enable signals. In particular, a first read enable signal (READ1) is coupled from the output of the parasitic interconnect capacitance delay 110, while a second read enable signal (READ2) is coupled from the output of the parasitic interconnect capacitance delay 112. READ1 and READ2 are coupled to a read circuit 120. The read circuit 120 generally reads data from memory elements of 121 of the memory device, and preferably comprises a secondary sense amplifier 122. Data from the secondary sense amplifier 122 is coupled to a first driver 124. The output of the first driver is coupled to a multiplexer 126 and a second driver 128. The output of the read circuit is coupled to an output circuit 130.

The output circuit 130 generally comprises a data input pointer circuit 132 and a data output pointer circuit 134. The data input pointer circuit receives a data input enable signal FI from the read timer 102 and generates an input pointer 135, while the data output pointer circuit receives a data output enable signal FO from the CAS latency logic circuit 137 and generates an output pointer 138. The output signals of the CAS latency logic circuit (FO) are derived from a delay-lock loop 136, the programmed CAS latency and the internal generated READ signal. The input pointer 135 and the output pointer 138 are coupled to the decoder 140. The decoder 140 uses the pointers to generate an input address 142 and an output address 144 respectively to properly address a FIFO buffer 144. That is, the decoder generates the appropriate address in the FIFO buffer based upon the input pointer 135 for data that is read from the memory elements 121, and generates the appropriate address to output data from the memory device based upon the output pointer 138. Finally, the output data 148 is coupled to an off chip driver (OCD) 150 and a contact pad 152.

Turning now to FIG. 2, the operation of the circuit will be described in more detail. A timing diagram shows the operation of the circuit of FIG. 1. In particular, the CAS signal which is coupled to the read timer 102 of FIG. 1, provides a periodic pulse as shown in FIG. 2. The first read enable signal READ1 coupled to the driver 124 provides a pulse at a time $t_1$ after the rising edge of the CAS signal. The second read enable signal READ2 coupled to the driver 128 provides a pulse at a time $t_2$ after the rising edge of the READ1 signal. The data input enable signal FI provides a rising edge of a pulse after a delay caused by parasitic interconnect capacitance delay 112. A DLLCLK signal generates the data output enable signal FO by generating a signal having a rising edge following the rising edge of the DLLCLK signal.

As can be seen in the timing diagram of FIG. 2, there is an idle time period between the data input enable signal FI and the data output enable signal FO. Because FI and FO are not synchronized, FI must generate a rising edge to load data in to the FIFO buffer 146 early enough before FO provides a rising edge to read out the data. Accordingly, FI may be earlier than necessary to ensure that the data is stored before it is accessed, therefore resulting in a shorter time $t_1$ to read the data from the memory element. As will be described in more detail in reference to FIGS. 3 and 4, the data input enable signal FI and the data output enable signal FO are synchronized, thereby maximizing the amount of time that the read circuit has to read data from a memory element 121. That is, the circuit of FIG. 3 maximizes the amount of time between the rising edge of the CAS signal and the rising edge of the READ1 signal. In other word the chip performance increases (i.e. can run at higher frequency) if this additional amount of time is reduced to a minimum amount of required sense time.

Turning now to FIG. 3, a circuit diagram of a memory device according to the present invention is shown. The circuit of FIG. 3 eliminates the read timer circuit, and employs a delayed-lock loop and a synchronization circuit to synchronize the read enable signal and the output enable signal to maximize the amount of time that the signal sense amplifier has to read data from a memory element. In particular, a delayed-lock loop circuit comprises a plurality of delay line elements 304–314. The delay line elements could be pairs of inverters coupled together as shown, or some other suitable delay circuit. While six delay line elements are shown, any number of delay line elements could be used. The delayed-lock loop circuit 302 also receives an external clock signal VCLK and outputs a DLLCLK signal.

The delayed-lock loop circuit 302 further generates a plurality of delayed clock signals which are coupled to a synchronization circuit 320. The synchronization circuit comprises logic circuits 322–326. Each logic circuit receives a synchronization enable signal and a delayed clock signal, and generates an enable signal. The synchronization enable signal is derived by the CAS latency logic circuit 360 which receives a delayed clock signal from delay line element 312, the CAS latency information and the internal generated READ signal. The CAS latency logic circuit also generates a data output enable signal FO. In particular, a first logic circuit 322 receives the synchronization enable signal and a delayed clock signal from delay line element 306 to generate a read enable signal READ1. Similarly, a second logic circuit 324 receives the synchronization enable signal and a delayed clock signal from delay line element 308 to generate a read enable signal READ2. The read enable signals READ1 and READ2 are coupled to a read circuit 330 which reads data from memory elements 331. The read circuit 330 comprises a secondary sense amplifier 332 coupled to a driver 334. The driver 334, which is enabled by the READ1 signal, provides an output to a multiplexer 336. The multiplexer 336 provides an output to a second driver 338 enabled by the READ2 signal. Finally, a third logic circuit 326 receives synchronization enable signal and a delayed clock signal from delay line element 310 to generate a data input enable signal FI.

The output circuit 340 generally comprises a data input pointer circuit 342 which receives a data input enable signal FI from the synchronization circuit 320 and generates an input pointer 343. Similarly, a data output pointer circuit 344 receives a data output enable FO from the CAS latency logic and generates an output pointer 345. The input pointer 343 and the output pointer 345 are coupled to the decoder 346. The decoder 346 enables the pointers to properly generate an input address 347 and an output address 348 respectively to properly address a FIFO buffer 349. Finally, the output data 350 is coupled to an off chip driver (OCD) 352 and a contact pad 354. The operation of the circuit will be described in more detail in reference to FIG. 4.

Figure 4:
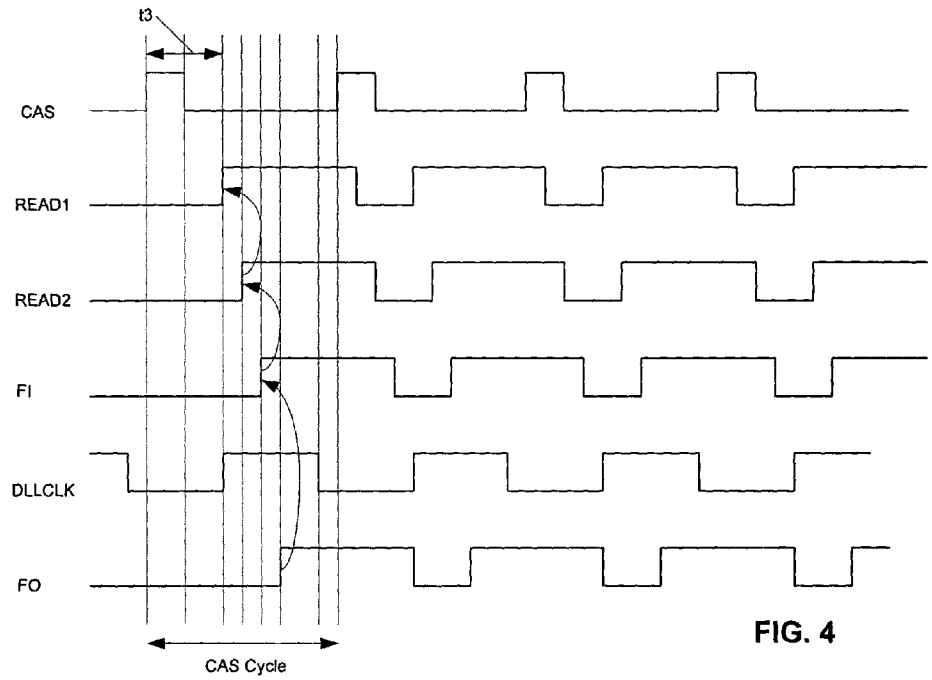
FIG. 4 is a timing diagram showing the operation of the circuit of FIG. 2.

Turning now to FIG. 4, a timing diagram shows the operation of the circuit of FIG. 3. In particular, the CAS signal which is coupled to the read timer 102 of FIG. 1, provides a periodic pulse as shown in FIG. 2. The first read enable signal READ1 coupled to the logic circuit 322 provides a pulse at a time $t_3$. The period $t_3$ from the rising edge of the CAS signal to the READ1 signal is greater than period $t_1$ in the prior art circuit of FIG. 1, as will be described in more detail below. The second read enable signal READ2 coupled to the logic circuit 324 provides a pulse at a time of one delay period of the delay line element 308 after the rising edge of the READ1 signal. The data input enable signal FI provides a rising edge of a pulse of the READ2 signal after a delay caused by after the delay line element 310. Finally, the data output enable signal FO has a rising edge following the rising edge of the DLLCLK signal.

As can be seen, there is no idle time period between the data input enable signal FI and the data output enable signal FO. Because the data input enable signal FI and the data output enable signal FO are synchronized, the amount of time that the read circuit has to read data from a memory element 121 is maximized. That is, the circuit of FIG. 3 maximizes the amount of time between the rising edge of the CAS signal and the rising edge of the READ1 signal because the enable signals are synchronized.

Turning now to FIG. 5, a flowchart shows a method of reading data according to the present invention. In particular, a delayed DLL clock signal is coupled to a data input pointer at a step 502. Data is coupled to a FIFO buffer based upon a delayed DLL clock signal at a step 504. Data is read out of the FIFO buffer based upon a delayed DLL clock signal at a step 506. The method of FIG. 5, or the FIGS. 6 and 7 described below, could be implemented using the circuit of FIG. 3, for example, or some other suitable circuit.

Turning now to FIG. 6, a flowchart shows a method of controlling a buffer according to the present invention. In particular, a DLL circuit having a plurality of fixed delays is provided at a step 602. A plurality of delayed clock signals are coupled to a synchronization circuit at a step 604. A synchronization enable signal is coupled to the synchronization circuit at a step 606. Finally, a FIFO buffer circuit is controlled with a delayed DLL signal and the synchronization enable signal at a step 608.

Turning now to FIG. 7, a flowchart shows a method of synchronizing a read signal and output signal according to the present invention. In particular, a DLL circuit having a plurality of fixed delays is provided at a step 702. A plurality of delay clock signals is coupled to a synchronization circuit at a step 704. A synchronization enable signal is coupled to the synchronization circuit at a step 706. A data input control signal based upon the DLL clock signal and the synchronization enable signal are coupled to a data input pointer at a step 708. Data is coupled into the buffer based upon the DLL clock signal at a step 710. A data output control signal based upon the DLL clock signal and the synchronization enable signal is coupled to a data output pointer at a step 712. Data is then read out of the FIFO buffer based upon the DLL clock at a step 714.

It can therefore be appreciated that the new and novel memory device and method of reading data from a memory device has been described. It will be appreciated by those skilled in the art that, given the teaching herein, numerous alternatives and equivalents will be seen to exist which incorporate the disclosed invention. As a result, the invention is not to be limited by the foregoing embodiments, but only by the following claims.

What is claimed is:

1. A memory device comprising:
a delay-locked loop circuit having a plurality of delay elements;
a synchronization circuit coupled to said delay-locked loop circuit and a synchronization enable signal, said synchronization circuit outputting a plurality of enable signals; and
an output circuit having a buffer coupled to a data input enable signal and a data output enable signal, said buffer circuit generating an output,
wherein said output circuit further comprises a data input pointer and a data output pointer.

2. The memory device of claim 1 wherein said delay-locked loop circuit receives an external clock signal.

3. The memory device of claim 1 further comprising a read circuit having a signal sense array.

4. The memory device of claim 3 wherein said synchronization circuit provides a first read enable signal to said read circuit.

5. The memory device of claim 3 wherein said synchronization circuit provides a second read enable signal to said read circuit.

6. The memory device of claim 1 further comprising a dynamic random access memory.

7. Memory device comprising:
a delay-locked loop circuit having a plurality of delay elements;
a synchronization circuit coupled to said delay-locked loop circuit and a synchronization enable signal, said synchronization circuit outputting a plurality of enable signals;
an output circuit having a buffer coupled to a data input enable signal and a data output enable signal, said buffer circuit generating an output; and
a data input pointer circuit coupled to receive said data input enable signal and a data output pointer circuit coupled to receive said data output enable signal.

8. The memory device of claim 7 further comprising a decoder coupled to receive an input pointer from said data input pointer circuit and generate an input address for said buffer.

9. The memory device of claim 8 wherein said decoder is further coupled to receive an output pointer from said data output pointer circuit and generate an output address for said buffer.

10. The memory device of claim 7 wherein said memory device comprises a dynamic random access memory.

11. A memory device comprising:
a delay-locked loop circuit having a plurality of delay elements;
a synchronization circuit coupled to said delay-locked loop circuit and a synchronization enable signal, said synchronization circuit outputting a plurality of enable signals;
an output circuit including a data input pointer circuit coupled to receive a data input enable signal from the plurality of enable signals and a data output pointer circuit coupled to receive a data output enable signal; and
a read circuit having a signal sense amplifier coupled to said synchronization circuit, said read circuit receiving a read enable signal from said synchronization circuit.

12. The memory device of claim 11 wherein the output circuit further comprises a buffer coupled to said synchronization circuit.

13. The memory device of claim 11 wherein said output circuit further comprises a decoder coupled to receive an input pointer from said data input pointer circuit and generate an input address for said buffer.

14. The memory device of claim 13 wherein said decoder is further coupled to an output pointer from said data output pointer circuit and generate an output address for said buffer.

15. A memory device comprising:
a delay-locked loop circuit having a plurality of delay elements, said delay-locked loop circuit generating a plurality of delayed clock signals;
a synchronization circuit coupled to said delay-locked loop circuit and receiving said plurality of delayed clock signals and a synchronization enable signal, said synchronization circuit outputting a data output enable signal; and
an output circuit having a buffer coupled to said synchronization circuit, said buffer circuit generating an output in response to said data output enable signal.

16. The memory device of claim 15 further comprising a read circuit having a signal sense amplifier coupled to said synchronization circuit, said read circuit receiving a read enable circuit from said synchronization circuit.

17. The memory device of claim 16 wherein said read enable circuit is based upon the synchronization enable signal and a delayed clock signal.

18. The memory device of claim 16 wherein said read circuit comprises a signal sense array coupled to a plurality of bit lines of said memory device.

19. A memory device comprising:
 a delay-locked loop circuit having a plurality of delay elements, said delay-locked loop circuit generating a plurality of delayed clock signals;
 a synchronization circuit coupled to said delay-locked loop circuit and receiving said plurality of delayed clock signals and a synchronization enable signal, said synchronization circuit outputting a plurality of enable signals;
 a read circuit comprising a signal sense amplifier, said read circuit receiving a read enable signal; and
 an output circuit coupled to said synchronization circuit, said output circuit receiving a data input enable signal enabling the storage of data in a buffer circuit and a data output enable signal enabling the output of data from said buffer circuit.

20. A method of reading data from a memory device, said method comprising:
 coupling an external clock signal to a delay-locked loop circuit;
 generating a plurality of delayed clock signals based upon said external clock signal;
 coupling a synchronization enable signal to a synchronization circuit;
 generating a read signal based upon said synchronization enable signal and a first delayed clock signal in the plurality of delayed clock signals of said external clock signal; and
 synchronizing a data output enable signal to said read signal.

21. The method of claim 20 further comprising a step of generating a data input enable signal based upon said synchronization enable signal and a second delayed clock signal.

22. The method of claim 20 further comprising a step of generating a data output enable signal based upon said synchronization enable signal and a third delayed clock signal.

23. The method of claim 20 wherein said step of generating a data output enable signal comprises a step of generating a data output enable signal which is synchronized to said read signal.

24. A method of reading data from a memory device, said method comprising:
 coupling an external clock signal to a delay-locked loop circuit;
 generating a plurality of delayed clock signals based upon said external clock signal;
 coupling a synchronization enable signal to a synchronization circuit;
 generating a read signal based upon said synchronization enable signal and said external clock signal; and
 generating a data output enable signal based upon said synchronization enable signal and said external clock.

25. The method of claim 24 further comprising a step of generating a data input enable signal based upon said synchronization enable signal and a second delayed clock signal.

26. The method of claim 24 wherein said step of generating a data output enable signal comprises generating a data output signal which is synchronized with said read signal.

27. The method of claim 24 further comprising a step of reading data from a dynamic random access memory.

* * * * *